(12) United States Patent
Lee et al.

(10) Patent No.: US 7,545,017 B2
(45) Date of Patent: Jun. 9, 2009

(54) WAFER LEVEL PACKAGE FOR SURFACE ACOUSTIC WAVE DEVICE AND FABRICATION METHOD THEREOF

(75) Inventors: Moon-chul Lee, Yongin-si (KR); Jun-sik Hwang, Yongin-si (KR); Ji-hyuk Lim, Suwon-si (KR); Woon-bae Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 317 days.

(21) Appl. No.: 11/447,969

(22) Filed: Jun. 7, 2006

(65) Prior Publication Data

US 2007/0176250 A1    Aug. 2, 2007

(30) Foreign Application Priority Data

Feb. 1, 2006    (KR) ...................... 10-2006-0009779

(51) Int. Cl.
*H01L 29/84* (2006.01)
(52) U.S. Cl. .................. 257/470; 257/416; 257/355; 257/678; 257/733; 257/787; 257/796; 257/E23.001; 257/E23.194
(58) Field of Classification Search ............. 257/416, 257/348, 678, 733, 787, 796, E23.001, E23.194, 257/470
See application file for complete search history.

(56) References Cited

U.S. PATENT DOCUMENTS

| | | | |
|---|---|---|---|
| 3,648,131 A | * | 3/1972 | Stuby ..................... 257/622 |
| 6,400,172 B1 | | 6/2002 | Akram et al. |
| 6,914,999 B2 | * | 7/2005 | Breukelaar et al. ......... 385/20 |
| 2004/0104791 A1 | | 6/2004 | Satoh et al. |
| 2004/0152348 A1 | | 8/2004 | Pedersen et al. |
| 2004/0232802 A1 | | 11/2004 | Koshido |
| 2006/0192462 A1 | * | 8/2006 | Iwamoto et al. ........... 310/348 |

FOREIGN PATENT DOCUMENTS

| | | |
|---|---|---|
| EP | 1432123 A2 | 6/2004 |
| JP | 08-213874 A | 8/1996 |

* cited by examiner

*Primary Examiner*—Howard Weiss
*Assistant Examiner*—Marc Armand
(74) *Attorney, Agent, or Firm*—Sughrue Mion, PLLC

(57) ABSTRACT

A wafer level package for a surface acoustic wave (SAW) device and a fabrication method thereof. The SAW device wafer level package includes a SAW device in which a SAW element is formed on a top surface of a device wafer, a cap wafer which is bonded with a top surface of the SAW device and has a viahole penetrating the cap wafer, and a conductive member to fill a part of the viahole. The viahole has a first via portion and a second via portion, the first via portion has a gradually smaller diameter from a bottom surface of the cap wafer until a certain depth, and the second via portion has a gradually greater diameter from the first via portion until a top surface of the cap wafer.

11 Claims, 5 Drawing Sheets

WAFER LEVEL PACKAGE FOR SURFACE ACOUSTIC WAVE DEVICE AND FABRICATION METHOD THEREOF

CROSS-REFERENCE TO RELATED APPLICATIONS

This application claims the benefit under 35 U.S.C. § 119 from Korean Patent Application No. 10-2006-9779 filed on Feb. 1, 2006, in the Korean Intellectual Property Office, the disclosure of which is incorporated herein by reference in its entirety.

BACKGROUND OF THE INVENTION

1. Field of the Invention

The present invention relates to a surface acoustic wave device wafer level package that packages a surface acoustic wave device according to a wafer level packaging method, and a fabrication method thereof.

2. Description of the Related Art

As an electronic device is developed to be compact and high-efficient, its electronic parts need to also be compact and high-efficient. A surface acoustic wave (SAW) device is generally used as an electronic part such as a filter, a delay line, or an oscillator of an electronic device transmitting and receiving waves, and is also employed as a radio frequency (RF) part in a mobile phone to suppress unnecessary signals. As mobile phones have become significantly compact and high-efficient, the SAW device including package also need be compact and high-efficient. Additionally, as the SAW device has been increasingly used for various purposes, demands for SAW devices have been significantly increasing, and reduction of the manufacturing costs is required.

A filter device, that is, a SAW filter 10, manufactured using a conventional SAW device, will be explained with reference to FIGS. 1A and 1B. As can be seen from the drawings, the SAW filter 10 comprises a ceramics package 11, a cavity 12 formed to be hollow in the package 11, a metal cap 13 to hermetically seal an opening of the cavity 12, and a SAW element 14 packed in the cavity 12. As can be seen in FIG. 1B, the package 11 forms a three layer structure in which three substrates 11a, 11b, and 11c are bonded. An electrode pad 15, a wire pattern 16, and a foot pattern 17 are formed over the substrates 11a, 11b, and 11c. The SAW element 14 is fixed on a bottom portion of the cavity 12 such that a surface with an interdigital transducer (IDT) faces up. The SAW device 14 is electrically connected with the wire pattern 15, which is exposed to an inside of the cavity 12, by a metal wire 18. The metal cap 13 is deposited onto a top surface of the package 11 by binding material 19 such as solder or resin.

The SAW filter 10 with the above configuration has the SAW element 14 that is electrically connected with the package 11 through a wire so as to hermetically seal the SAW element, and the metal cap 13 is deposited onto the top surface of the package 11 so that there is a limit of how compact the SAW filter 10 can be made. As a size of the SAW element 14 gets smaller, manufacturing of the SAW filter 10 becomes more complicated so that the manufacturing cost can increase.

Accordingly, various methods have been developed using wafer level packaging technology to miniaturize the SAW device. Particularly, studies for a SAW device having a SAW element on a wafer, and for a packaging method by binding a packaging cap with a top portion of the SAW device have been developed.

SUMMARY OF THE INVENTION

The present invention has been conceived to solve the above-mentioned problems occurring in the prior art, and an aspect of the present invention is to provide a SAW device wafer level package having an improved structure so as to be miniaturized, and a fabrication method thereof.

In order to achieve the above aspects, there is provided a surface acoustic wave (SAW) device wafer level package including a SAW device in which a SAW element is formed on a top surface of a device wafer, a cap wafer which is bonded with a top surface of the SAW device and has a viahole penetrating the cap wafer, a conductive member to fill a part of the viahole, wherein the viahole has a first via portion and a second via portion, the first via portion has a gradually smaller diameter from a bottom surface of the cap wafer until a certain depth, and the second via portion has a gradually greater diameter from the first via portion until a top surface of the cap wafer.

The SAW device may further include a device pad formed on the top surface of the device wafer to connect with the SAW element, and a device sealing line formed on the top surface of the device wafer.

The SAW device wafer level package may further include a cap pad formed on the top surface of the cap wafer, and a connection pad formed on the bottom surface of the cap wafer to electrically connect with the cap pad through the conductive member.

The conductive member may include a first metal layer, which is formed to cover insides of the first via portion and the second via portion, and a lower end of which is electrically connected with the connection pad, and a second metal layer, which is formed on the first metal layer to fill the second via portion, to be electrically connected with the cap pad.

The second metal layer may be formed by electroplating an upper portion of the first metal layer.

The cap pad may be formed to cover an upper portion of the viahole.

The connection pad may be connected with the conductive member at a boundary between the viahole and the bottom surface of the cap wafer.

The SAW device wafer level package may further include a sealing line formed on a bottom surface of the cap wafer to be extended from a boundary between the viahole and the bottom surface of the cap wafer.

The SAW device wafer level package may further include a cavity formed between the cap wafer and the SAW device to receive the SAW element.

The cap wafer may be formed of LiTaO$_3$ or LiNbO$_3$.

The SAW device may be formed of the same material as the cap wafer.

The first via portion may be formed to have a deeper depth than the second via portion.

In order to achieve the above aspects, there is provided a SAW device wafer level packaging method, including operations of a) forming a SAW device in which a SAW element is formed on a top surface of a device wafer, b) forming a cap wafer in which a conductive member fills a part of the viahole that has a first via portion and a second via portion, the first via portion has a gradually smaller diameter from a bottom surface of the cap wafer until a certain depth, and the second via portion has a gradually greater diameter from the first via portion until a top surface of the cap wafer, c) bonding the packaging cap with a top surface of the SAW device.

The operation b) may include operations of b1) etching the bottom surface of the cap wafer by a certain depth to form the first via portion, b2) etching the top surface of the cap wafer by a certain depth to the second via portion to connect with the first via portion, and b3) filling the first via portion and the second via portion with metal materials of each different amount ratio to form the conductive member.

The operation b) may include operations of b4) forming the cap pad on the top surface of the cap wafer to electrically connect with the conductive member, and b5) forming a connection pad, which electrically connects with the conductive member, and a cap sealing line, which is short-circuited with the conductive member, on the bottom surface of the cap wafer.

The operations b1) and b2) may form the first via portion and the second via portion to have each different depth.

The forming of the first via portion may include operations of patterning a dry film resist on the bottom surface of the cap wafer, and sandblasting the bottom surface of the cap wafer, which is exposed by the dry film resist.

The forming of the second via portion may include operations of patterning a dry film resist on the top surface of the cap wafer, and sandblasting the top surface of the cap wafer, which is exposed by the dry film resist.

The operation b3) may include operations of depositing a first metal layer to cover a surface of the cap wafer including the viahole, electroplating a metal material on the first metal layer to fill the second via portion, and grinding the top surface and the bottom surface of the cap wafer to be exposed and removing the first metal layer from the top surface and the bottom surface of the cap wafer.

The operation b4) may pattern and form the cap pad so as to be disposed above the viahole and cover the conductive member.

The operation b5) may include a first operation forming a metal material by a certain depth to cover the bottom surface of the cap wafer, and a second operation etching the metal material according to a certain pattern using a photo resist to simultaneously form the connection pad and the cap sealing line.

The second operation may include operations of partially removing the conductive member in the viahole so that a part of the viahole is exposed and the conductive member can be short-circuited with the cap sealing line.

The operation b5) may include a first operation forming a metal material by a certain thickness to cover the bottom surface of the cap wafer, and a second operation etching the metal material according to a certain pattern using a photo resist to simultaneously form the connection pad and the cap sealing line, and partially removing the first metal layer in the viahole for the cap sealing line to be short-circuited with the first metal layer.

The operation a) may include an operation of forming a device pad and a device sealing line on the top surface of the device wafer.

The operation c) may be performed by bonding a cap sealing line, which is formed on a bottom surface of the cap wafer, with a device sealing line, which is formed on a top surface of the device wafer.

The cap wafer may be formed of $LiTaO_3$ or $LiNbO_3$.

The device wafer may be formed of the same material as the cap wafer.

BRIEF DESCRIPTION OF THE DRAWINGS

The above and other aspects, features and advantages of the present invention will be more apparent from the following detailed description taken with reference to the accompanying drawings, in which.

DETAILED DESCRIPTION OF THE EXEMPLARY EMBODIMENTS

Figure 1A:
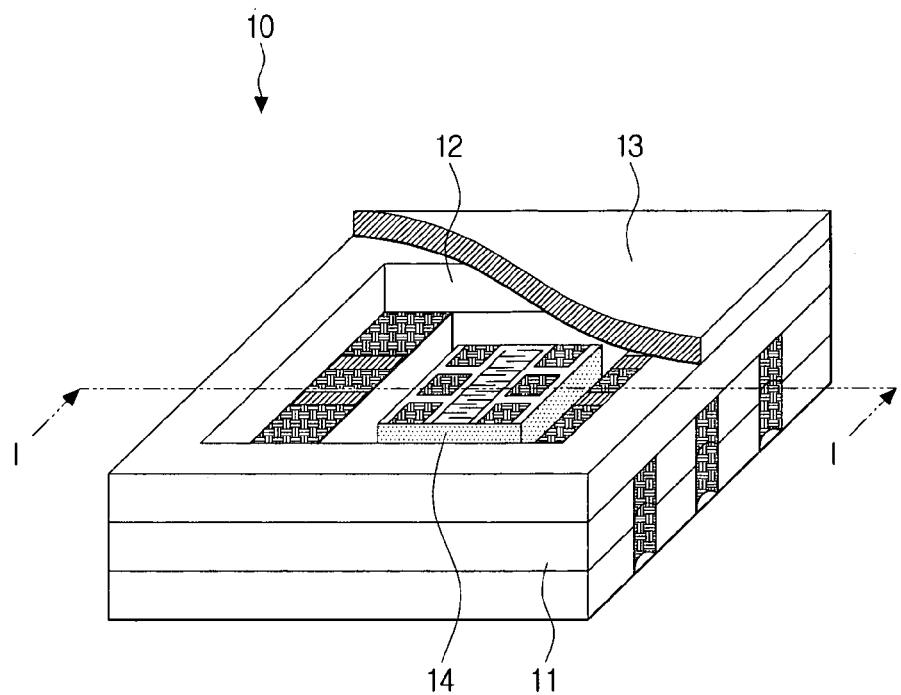
FIG. 1A is a perspective view schematically illustrating a conventional surface acoustic wave device package.
Figure 1B:
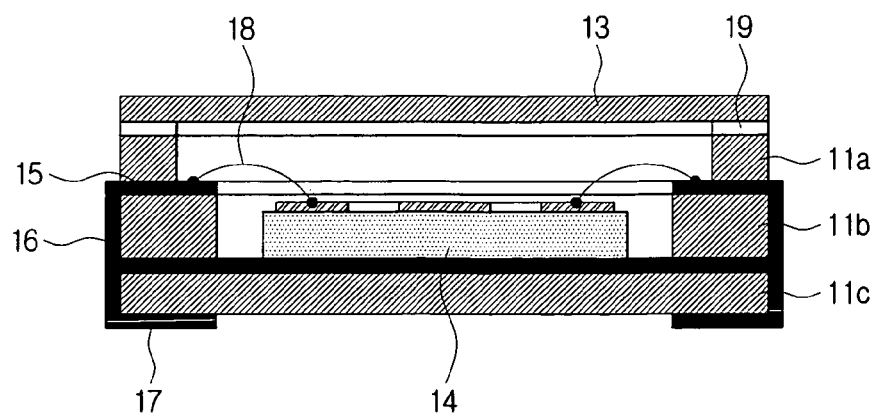
FIG. 1B is a cross-sectional view illustrating a conventional surface acoustic wave device package taken on line I-I of FIG. 1A.

Exemplary embodiments of the present invention will be described in detail with reference to the annexed drawings. In the drawings, the same elements are denoted by the same reference numerals throughout the drawings. In the following description, detailed descriptions of known functions and configurations incorporated herein have been omitted for conciseness and clarity. The described exemplary embodiments are intended to assist the understanding of the invention, and are not intended to limit the scope of the invention in any way.

Figure 2:
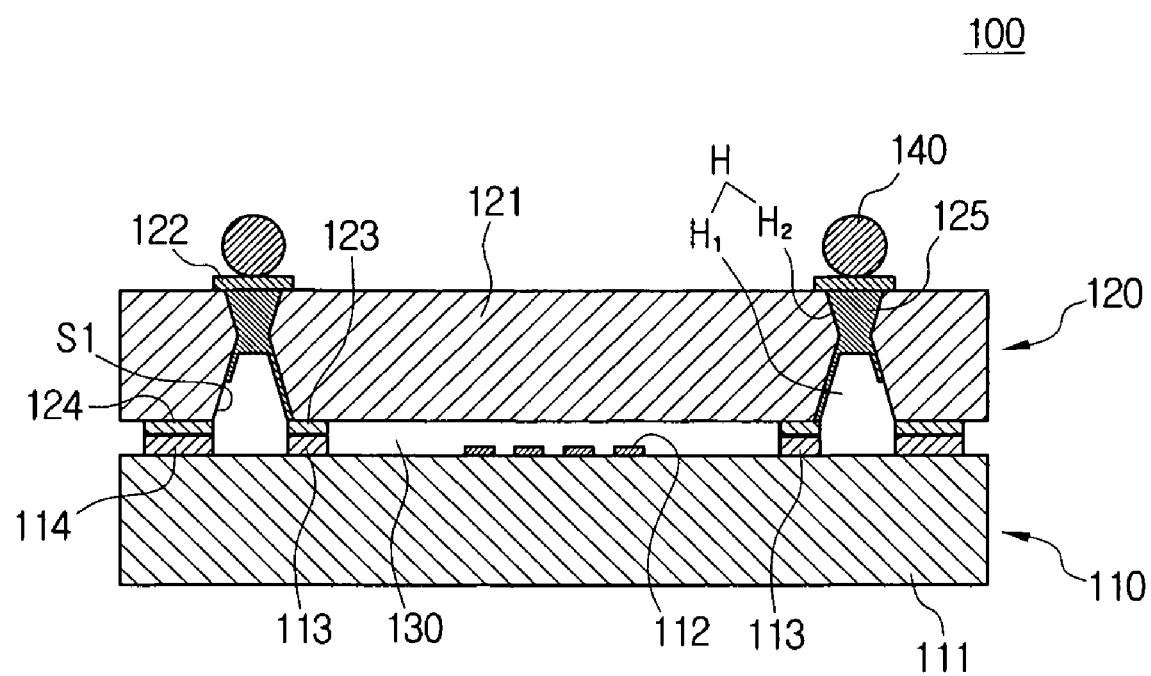
FIG. 2 is a cross-sectional view illustrating a surface acoustic wave device wafer level package according to an exemplary embodiment of the present invention.

Referring to FIG. 2, a surface acoustic wafer (SAW) device wafer level package 100 comprises a SAW device 110 in which a SAW element 112 is formed on a top surface of a device wafer 111, and a packaging cap 120 bonded with a top surface of the SAW device 110. The packaging cap 120 is bonded with the SAW device 110 so that a cavity 130, which is formed between the packaging cap 120 and the SAW device 110, receives the SAW element 112.

The SAW device 110 comprises the device wafer 111 formed of piezoelectric material such as $LiTaO_3$ or $LiNbO_3$, the SAW element 112 formed on a top surface of the device wafer 111, a device pad 113 formed on a top surface of the device wafer 111 according to a predetermined pattern, and a device sealing line 114.

The SAW element 112 may be formed on a bottom portion of the cavity 130, that is, on a top surface of the device wafer 111 for a surface with an InterDigital transducer to face up. The SAW element 112 may be formed by depositing metal material on the device wafer 111 according to a predetermined pattern. On the top surface of the device wafer 111, the device pad 113 and the device sealing line 114 are formed to have the same height as each other. The device pad 113 and the device sealing line 114 may be formed of the same metal material. For example, the SAW element 112, the device pad 113, and the device sealing line 114 may be mainly formed of Au, Al, Cu, Ti, Cr, Ta, and Ni. The device pad 113 is provided in a plurality. The device sealing line 114 is to bond the SAW device 110 with the packaging cap 120 for packaging.

The packaging cap 120 comprises a cap wafer 121 with a viahole H, a cap pad 122 formed on a top surface of the cap wafer 121, a connection pad 123 formed on a bottom surface of the cap wafer 121, and a cap sealing line 124.

The cap wafer 121 may be formed of the same material as the device wafer 111. The viahole H upwardly and downwardly penetrates the cap wafer 121. The viahole H comprises a first via portion H1 formed to a certain depth from a bottom surface of the cap wafer 121, and a second via portion H2 formed to a certain depth from a top surface of the cap wafer 121. The first via portion H1 and the second via portion H2 are each formed to have a gradually smaller diameter from the outside surface of the cap wafer 121 towards the center of the cap wafer 121, and are connected to each other. The top surface and the bottom surface of the cap wafer 121 are etched according to separate processes so that the viahole H is divided into the first via portion H1 and the second via portion H2. Particularly, the first via portion H1 and the second via portion H2 are formed to have different depths. In the present exemplary embodiment, the second via portion H2, which will be fully filled with a conductive member 125, is formed to have a smaller depth than the first via portion H2.

The viahole H is filled with the conductive member 125. The conductive member 125, which will be in detail explained below, is formed by depositing a metal material to form a seed layer and electroplating a metal material on the seed layer, which is a metal layer, to fill the viahole H. The conductive member 125 entirely fills the second via portion H2 to connect with the cap pad 122, and is sprayed by a predetermined thickness over a part of an inside of the first via portion H1. Accordingly, an upper portion of the conductive member 125 is connected with the cap pad 122, and a lower portion of the conductive member 125 is connected with the connection pad 123 so as to electrically connect the cap pad 122 and the connection pad 123. The conductive member 125 is not electrically connected with the cap sealing line 124.

Cap pads 122 are formed on a direct top surface of the cap wafer 121 to correspond to each viahole H, and preferably, but not necessarily, they are formed according to a certain pattern to cover the conductive member 125 formed in the viahole H. The cap pads 122 are formed by patterning a metal material on the top surface of the cap wafer 121.

There are a plurality of connection pads 123 to correspond to the number of the device pads 113. The connection pads 123 are bonded with the device pads 113 to be electrically connected.

The cap sealing line 124 is formed of the same material as the connection pad 123, and may be formed simultaneously with the connection pad 123. The cap sealing line 124 is formed to correspond to the device sealing line 114. Accordingly, while bonding the connection pads 123 with the device pads 113, bonding the device sealing line 114 with the cap sealing line 124 makes the cavity 130 airtight.

The connection pad 123 is extended according to a certain pattern from a boundary between the viahole H and a bottom surface of the cap wafer 121 so as to be connected with the conductive member 125. The cap sealing line 124 is extended according to a certain pattern from a boundary between the viahole H and a bottom surface of the cap wafer 121 so as to come into contact with an exposed surface S1 of the viahole H. Accordingly, the cap sealing line 124 can be short-circuited with the conductive member 125.

As described above, when formed on the cap wafer 121, the cap pads 122 are formed on each top portion of the viahole H so that intervals between the cap pads 122 can be narrow and a size of the packaging cap 120 can be reduced.

When formed on the bottom surface of the cap wafer 121, the connection pads 123 and the cap sealing lines 124 are formed to come into contact with the viahole H. Accordingly, a distance between the cap sealing lines 124 formed at opposite side of the packaging cap 120 can be shortened so that the left and right size of the packaging cap 120 in the drawing can be reduced.

Additionally, the viahole H is divided into up and down, that is, the first via portion H1 and the second via portion H2 so that the diameter of the viahole H can be minimally formed. The diameter of the viahole H is minimized, and accordingly, a high degree of freedom in designing various patterns can be provided so that the interval between the cap sealing lines 124 can be reduced.

In FIG. 2, reference numeral 140 denotes a solder ball formed on the cap pads 122. The solder ball 140 is for mounting the completed SAW device wafer level package onto a printed circuit board (PCB) substrate.

The method for fabricating the SAW device wafer level package with the above structure will be explained.

Figure 3A:
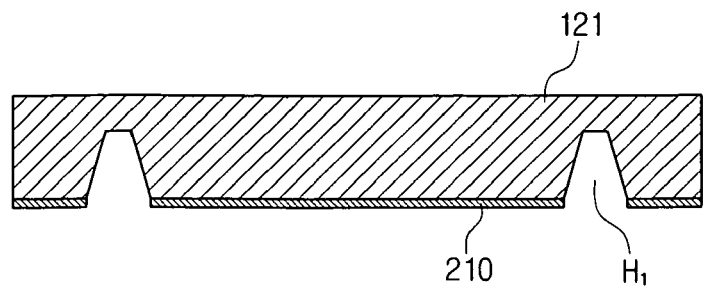
FIGS. 3A through 3H are cross-sectional views of the surface acoustic wave device wafer level package illustrated in FIG. 2 to explain a process of manufacturing the same.

First, a dry film resist (DFR) 210 is patterned on a bottom surface of the cap wafer 121 and the bottom surface of the cap wafer 121, which is exposed through the dry film resist 210, is etched by a certain depth to form the first via portion H1 as shown in FIG. 3A. The first via portion H1 may be formed according to a sand blasting so that it has a gradually narrower diameter as further from the bottom surface of the cap wafer 121.

Figure 3B:
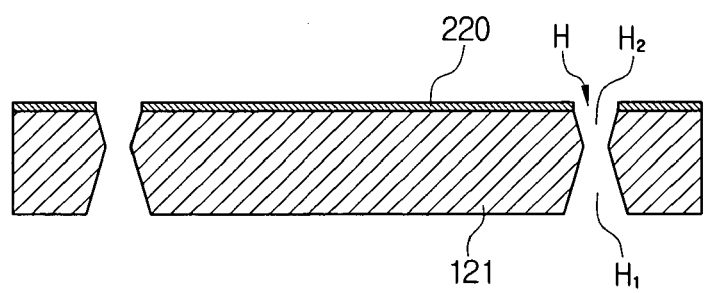

As shown in FIG. 3B, a dry film resist 220 is patterned on the top surface of the cap wafer 121 and the top surface of the cap wafer 121, which is exposed through the dry film resist 220, is etched to form the second via portion H2. The second via portion H2 may be formed also by sand blasting. The second via portion H2 is formed with such a depth so as to connect with the first via portion H1. In other words, the bottom surface and the top surface of the cap wafer 121 are etched according to two steps to form the viaholes H so that the diameter of the viahole H is prevented from unnecessarily enlarging and accordingly, the viahole H can be formed in a small size. The second via portion H2 is formed to have a lower depth than the first via portion H1. To this end, preferably, but not necessarily, the first via portion H1, which is earlier formed, may be formed to have a sufficiently long depth. The second via portion H2 is formed also to have a gradually narrower diameter as it gets further from the top surface of the cap wafer 121.

Figure 3C:
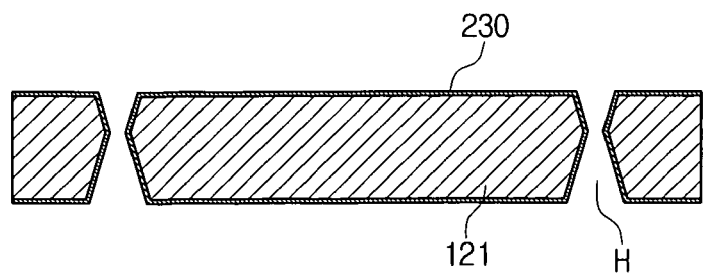

As shown in FIG. 3C, a seed layer 230 is formed to a certain thickness on an exposed surface of the cap wafer 121. The seed layer 230 may be formed by depositing a metal material. The seed layer 230 is formed to cover all the inside of the viahole H including the top surface and bottom surface of the cap wafer 121. The seed layer 230 may be formed of a metal mainly comprising Cr, Au, and Cu.

Figure 3D:
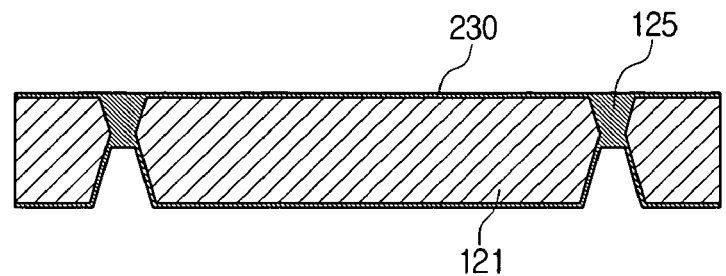

As shown in FIG. 3D, when the seed layer 230 is electroplated with a metal material, the first via portion H2 is filled so that the conductive member 125 can be formed as explained with reference to FIG. 2. In detail, if the viahole H is electroplated on the top surface of the cap wafer 121, the metal material fills only the second via portion H2, but passes the first via portion H1 as unfilled, because the diameter of the boundary between the second via portion H2 and the first via portion H1 becomes the narrowest. Accordingly, only the seed layer 230, which is previously deposited, is left on the first via portion H1. The viahole H is divided into the first via portion H1 and the second via portion H2 so that the viahole H can be partially electroplated and filled. According to this, another after-processes can be easily performed including a process of partially patterning the seed layer 230 of the first via portion H1, which is not filled with a metal material. This advantage will be explained below. Here, the earlier-deposited seed layer 230 is referred to as a first metal layer and the later-deposited seed layer 230 is referred to as a second metal layer.

Figure 3E:
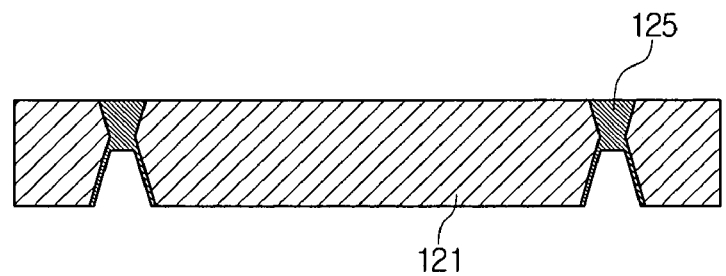

After forming the conductive member 125 by electroplating, the top surface and the bottom surface of the cap wafer 121 each are ground and planarized as shown in FIG. 3E. The planarizing, for example, a grinding and a polishing, removes the seed layer 230 formed on the top surface and the bottom surface of the cap wafer 121.

Figure 3F:
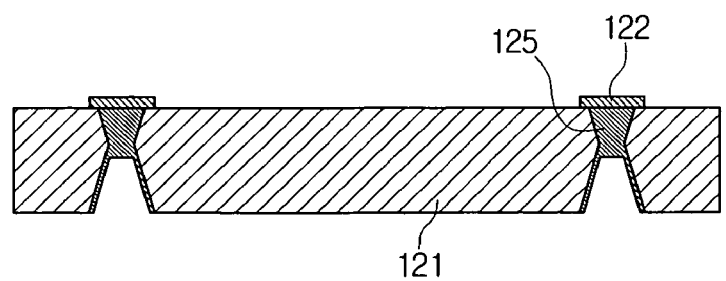

As shown in FIG. 3F, the cap pads 122 are formed on the top surface of the cap wafer 121. The cap pad 122 may be formed by spraying a metal material on the top surface of the cap wafer 121 and pattering a mask. The cap pad 122 is formed to cover a direct top portion, that is, the conductive member 125, of the viahole H.

Figure 3G:
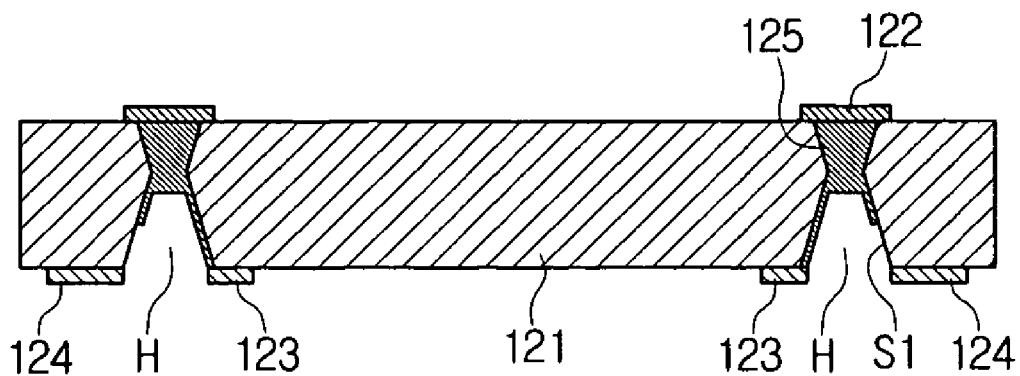

As shown in FIG. 3G, the connection pad 123 and the cap sealing line 124 are formed on the bottom surface of the cap wafer 121. The connection pad 123 is extended from the boundary between the viahole H and the bottom surface of the cap wafer 121 so as to be electrically connected with the conductive member 125. When extended from the boundary between the viahole H and the bottom surface of the cap wafer 121, the cap sealing line 124 comes into contact with the exposed surface S1, from which the conductive member 125 is removed, so as to be short-circuited with the conductive member 125. The connection pad 123 and the cap sealing line 124 may be simultaneously formed of the same metal material, and have the same height as each other.

The exposed surface S1 is formed as following process: the metal material is formed on the bottom surface of the cap wafer 121, the metal material is patterned using a photo resist to form the connection pad 123 and the cap sealing line 124; at this time, a part of the conductive member 125 is together patterned so that the exposed surface S1 can be formed.

The connection pad 123 and the cap sealing line 124 may be formed according to a lift off.

According to the above method, the connection pad 123 and the cap sealing line 124 can be formed around the viahole H. Accordingly, the interval between the connection pads 123, which are disposed at the right and left sides in the drawings, can be reduced. In other words, if the connection pads are formed on a direct bottom portion of the viahole H, the interval between the connection pads is spaced apart so that the size of the cap wafer 121 becomes great. Additionally, since the cap sealing line 124 can also be formed adjacent to the viahole H, a high degree of freedom in the designing is provided so that the size of the cap wafer 121 can be reduced. The connection pad 123 and the cap sealing line 124 may be formed of Au, Cu, or Al.

Figure 3H:
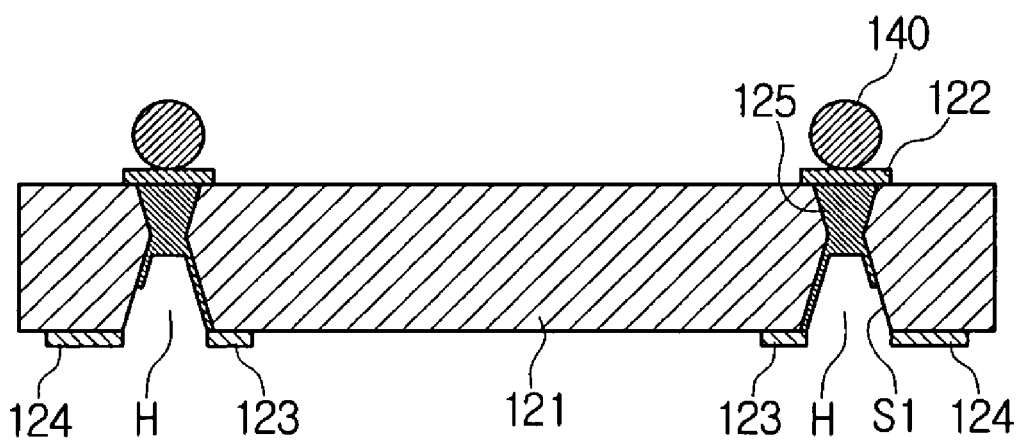

As shown in FIG. 3H, the solder ball 140 may be formed on the top portion of the cap pad 122. The solder ball 140 may be formed also after the cap wafer 121 is packaged with the SAW device 110.

When the fabricating of the packaging cap 120 is completed according to the above process, the packaging cap 120 is bonded with the SAW device 110, which is fabricated according to another separate process so that the SAW device wafer level package is completed.

The SAW device 110 can be simply fabricated by patterning and forming the SAW element 112, the device pad 113, and the device sealing line 114 on the device wafer 111.

When the completed packaging cap 120 is bonded with the top surface of the SAW device 110, the connection pad 123 is bonded with the device pad 113 and the cap sealing line 124 is bonded with the device sealing line 114. Then, the cavity 130 receiving the SAW element 112 is hermetically sealed, and the SAW device 112 can be connected with exterior electronic devices through the device pad 113, the connection pad 123, the conductive member 125 and the cap pad 122.

As described above, if the SAW device wafer level package and fabrication method thereof according to exemplary embodiments of the present invention are applied, the SAW device wafer and the packaging cap are fabricated according to separate processes and then packaged. Accordingly, a simplified and miniaturized SAW device wafer level package can be provided.

The viahole is formed according the first process and the second process on the cap wafer of the packaging cap so that the size of the viahole can be reduced. Particularly, the viahole is formed to have each different depth on the top surface and the bottom surface of the cap wafer such that it can be divided into the first via portion and the second via portion. Accordingly, when filled by electroplating, the viahole can be partially filled. Therefore, the seed layer of the unfilled first via portion can be easily fabricated in the following processes. Furthermore, electrical characteristic of the conductive member by the electroplating can be improved.

Furthermore, the size of the viahole is reduced so that the degree of freedom in designing the forming location of the cap pad and the connection pad, which are electrically connected through the viahole, can increase. Accordingly, the size of the package can be reduced.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A surface acoustic wave (SAW) device wafer level package comprising:
 a SAW device in which a SAW element is formed on a top surface of a device wafer;
 a cap wafer which is bonded with a top surface of the SAW device and has a viahole penetrating the cap wafer;
 a conductive member to fill a part of the viahole; and
 a sealing line formed on a bottom surface of the cap wafer to be extended from a boundary between the viahole and the bottom surface of the cap wafer;
 wherein the viahole has a first via portion and a second via portion, the first via portion has a gradually smaller diameter from a bottom surface of the cap wafer until a certain depth, and the second via portion has a gradually greater diameter from the first via portion until a top surface of the cap wafer, and
 wherein the conductive member is electrically isolated from the sealing line.

2. The SAW device wafer level package as claimed in claim 1, wherein the SAW device further comprises:
 a device pad formed on the top surface of the device wafer to connect with the SAW element; and
 a device sealing line formed on the top surface of the device wafer.

3. The SAW device wafer level package as claimed in claim 1, comprising:
 a cap pad formed on the top surface of the cap wafer; and
 a connection pad formed on the bottom surface of the cap wafer to electrically connect with the cap pad through the conductive member.

4. The SAW device wafer level package as claimed in claim 1, further comprising:
 a cavity formed between the cap wafer and the SAW device to receive the SAW element.

5. The SAW device wafer level package as claimed in claim 1, wherein the cap wafer formed of $LiTaO_3$ or $LiNbO_3$.

6. The SAW device wafer level package as claimed in claim 1, wherein the first via portion is formed to have a greater depth than the second via portion.

7. The SAW device wafer level package as claimed in claim 3, wherein the conductive member comprises:

a first metal layer, which is formed to cover inside surfaces of the first via portion and the second via portion, and a lower end of which is electrically connected with the connection pad; and a second metal layer, which is formed on the first metal layer to fill the second via portion, and is electrically connected with the cap pad.

8. The SAW device wafer level package as claimed in claim 3, wherein the cap pad is formed to cover an upper portion of the viahole.

9. The SAW device wafer level package as claimed in claim 3, wherein the connection pad is connected with the conductive member at a boundary between the viahole and the bottom surface of the cap wafer.

10. The Saw device wafer level package as claimed in claim 5, wherein the SAW device is formed of the same material as the cap wafer.

11. The SAW device wafer level package as claimed in claim 7, wherein the second metal layer is formed by electroplating an upper portion of the first metal layer.

* * * * *